United States Patent
Ishikawa

(10) Patent No.: US 12,132,410 B2
(45) Date of Patent: Oct. 29, 2024

(54) POWER CONVERSION DEVICE AND MOTOR

(71) Applicant: HITACHI ASTEMO, LTD., Hitachinaka (JP)

(72) Inventor: Shoho Ishikawa, Hitachinaka (JP)

(73) Assignee: HITACHI ASTEMO, LTD., Hitachinaka (JP)

(*) Notice: Subject to any disclaimer, the term of this patent is extended or adjusted under 35 U.S.C. 154(b) by 209 days.

(21) Appl. No.: 17/785,794

(22) PCT Filed: Nov. 27, 2020

(86) PCT No.: PCT/JP2020/044165
§ 371 (c)(1),
(2) Date: Jun. 15, 2022

(87) PCT Pub. No.: WO2021/124831
PCT Pub. Date: Jun. 24, 2021

(65) Prior Publication Data
US 2023/0061556 A1    Mar. 2, 2023

(30) Foreign Application Priority Data

Dec. 16, 2019  (JP) ................... 2019-226578

(51) Int. Cl.
*H02M 7/00*     (2006.01)
*H05K 9/00*     (2006.01)

(52) U.S. Cl.
CPC .......... *H02M 7/003* (2013.01); *H05K 9/0009* (2013.01)

(58) Field of Classification Search
CPC ............ H05K 7/1432; H05K 7/14322; H05K 5/0026; H05K 7/14329; H05K 5/0247;
(Continued)

(56) References Cited

U.S. PATENT DOCUMENTS

2003/0200761 A1* 10/2003 Funahashi ........... F04C 29/0085
                                                          62/228.4
2008/0112201 A1   5/2008 Yahata et al.
(Continued)

FOREIGN PATENT DOCUMENTS

JP    2003-324903 A    11/2003
JP    2008-125240 A     5/2008
(Continued)

OTHER PUBLICATIONS

International Search Report with English Translation and Written Opinion of International Application PCT/JP2020/044165 mailed Mar. 2, 2021.

*Primary Examiner* — James Wu
*Assistant Examiner* — Dakota M Talbert
(74) *Attorney, Agent, or Firm* — Foley & Lardner LLP

(57) ABSTRACT

A device includes a circuit board, a power conversion module disposed to face the circuit board, a bus bar connected to the power conversion module, and a shielding portion that shields an electromagnetic wave. The bus bar extends through a side edge of the circuit board from one side to an opposite side of the circuit board along a thickness direction of the circuit board. The shielding portion is disposed between the bus bar and the side edge of the circuit board, extends from the one side to the opposite side along the thickness direction of the circuit board, and extends to both sides of the bus bar along the side edge of the circuit board.

8 Claims, 12 Drawing Sheets

(58) Field of Classification Search
CPC ............ H05K 7/20845; H05K 7/2089; H05K 9/0007; H05K 9/0022; H02M 7/003; H02M 1/44
See application file for complete search history.

(56) References Cited

U.S. PATENT DOCUMENTS

| | | |
|---|---|---|
| 2013/0294040 A1 | 11/2013 | Fukumasu et al. |
| 2016/0037654 A1 | 2/2016 | Kosuga et al. |
| 2021/0084756 A1* | 3/2021 | Del Rosal ................ H05K 3/28 |

FOREIGN PATENT DOCUMENTS

| | | |
|---|---|---|
| JP | 2012-139016 A | 7/2012 |
| JP | 2014-176271 A | 9/2014 |

* cited by examiner

POWER CONVERSION DEVICE AND MOTOR

TECHNICAL FIELD

The present disclosure relates to a power conversion device and a motor.

BACKGROUND ART

In the related art, a power conversion device used for a hybrid vehicle or an electric vehicle has been known (see PTL 1 below). A conventional power conversion device described in PTL 1 has an object of further improving connection reliability of internal components of the power conversion device, and has the following configuration as a means for solving the object (Refer to PTL 1, paragraph 0007, paragraph 0008, claim 1, and the like).

The conventional power conversion device includes a power semiconductor module, a casing, an AC relay bus bar, and an AC terminal block. The power semiconductor module converts a DC current into an AC current. The casing forms a storage space for storing the power semiconductor module. The AC relay bus bar is connected to an AC terminal of the power semiconductor module by melt connection. The AC terminal block is connected to an AC terminal of a motor. The AC relay bus bar is supported by the casing via an insulation member, and the AC terminal block is connected to the AC relay bus bar and supported by the casing.

More specifically, both the AC relay bus bar and the AC terminal block are supported by a flow path forming body having a function as a casing. Therefore, a load applied when the AC connector of the motor is attached is dispersed to the flow path forming body via the AC terminal block. Further, the load that has not been dispersed by the AC terminal block is subjected to stress dispersion from the AC bus bar to the flow path forming body via the AC relay bus bar. As a result, before the load applied when the AC connector of the motor is attached reaches the AC welded connection portion, the stress is dispersed in two stages, and the stress generated in the welded portion can be eliminated as much as possible (Refer to PTL 1, paragraph 0094, paragraph 0095, FIG. 13, and the like).

CITATION LIST

Patent Literature

PTL 1: JP 2014-176271 A

SUMMARY OF INVENTION

Technical Problem

The above-described conventional power conversion device can achieve an excellent effect that the connection reliability of the internal components of the power conversion device can be further improved. However, in such a power conversion device, with the demand for further miniaturization, there is a limitation on the layout of components including a circuit board, a power conversion module, a bus bar, and the like, and the influence of electromagnetic waves on the circuit board tends to increase.

The present disclosure provides a power conversion device that can be downsized with the influence of electromagnetic waves on a circuit board reduced as compared with the related art, and a motor including the power conversion device.

Solution to Problem

An aspect of the present disclosure is a power conversion device including a circuit board, a power conversion module disposed to face the circuit board, a bus bar connected to the power conversion module, and a shielding portion that shields an electromagnetic wave, wherein the bus bar extends through a side edge of the circuit board from one side to an opposite side of the circuit board along a thickness direction of the circuit board, and wherein the shielding portion is disposed between the bus bar and the side edge of the circuit board, extends from the one side to the opposite side along the thickness direction of the circuit board, and extends to both sides of the bus bar along the side edge of the circuit board.

Advantageous Effects of Invention

According to the above aspect of the present disclosure, it is possible to provide a power conversion device that can be downsized with the influence of electromagnetic waves on a circuit board reduced as compared with the related art and downsizing, and a motor including the power conversion device.

DESCRIPTION OF EMBODIMENTS

Hereinafter, embodiments of a power conversion module and a motor of the present disclosure will be described with reference to the drawings.

Figure 1:
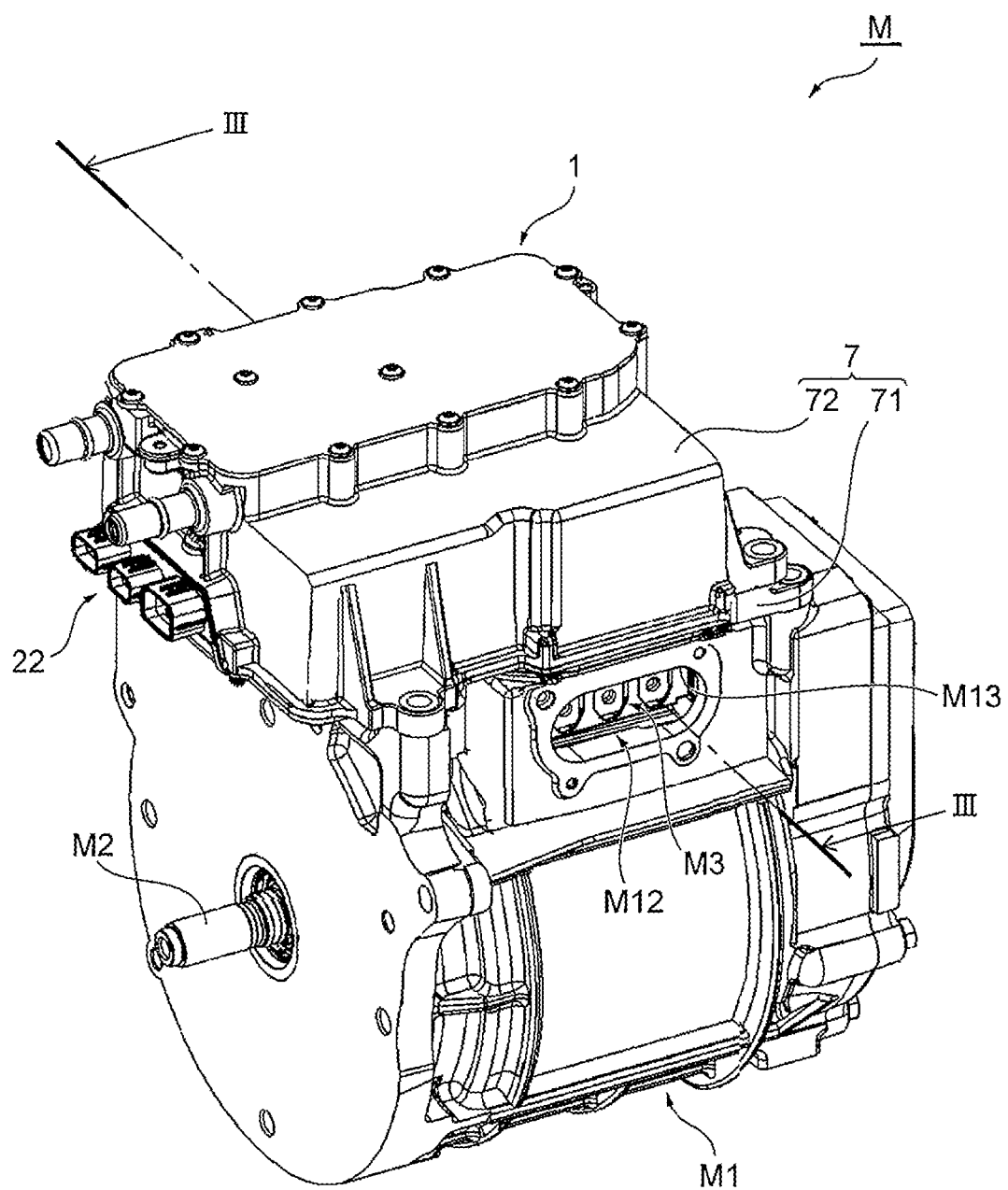
FIG. 1 is a perspective view showing an embodiment of a power conversion device and a motor of the present disclosure.
Figure 2:
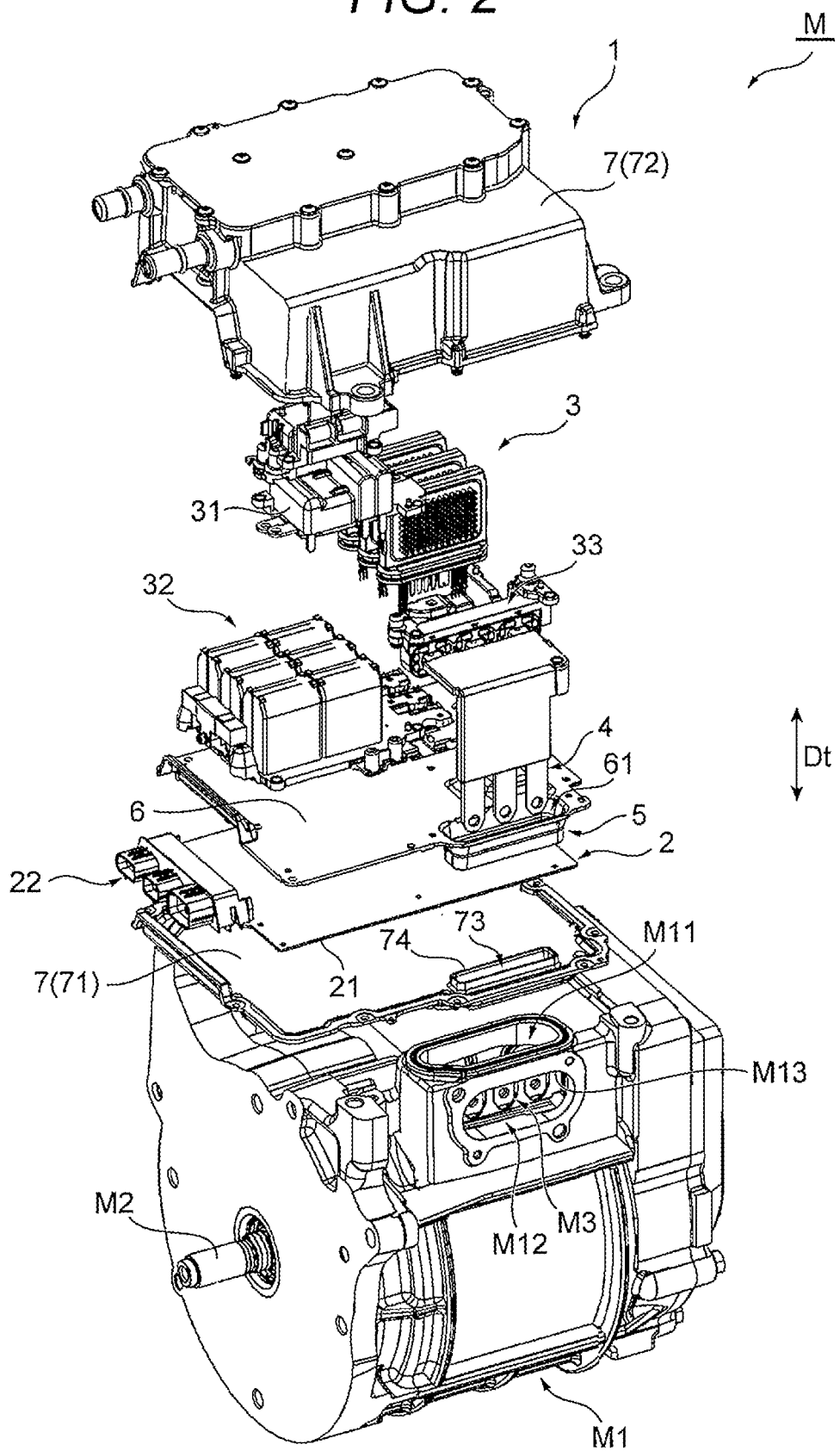
FIG. 2 is an exploded perspective view of the power conversion device and the motor illustrated in FIG. 1.
Figure 3:
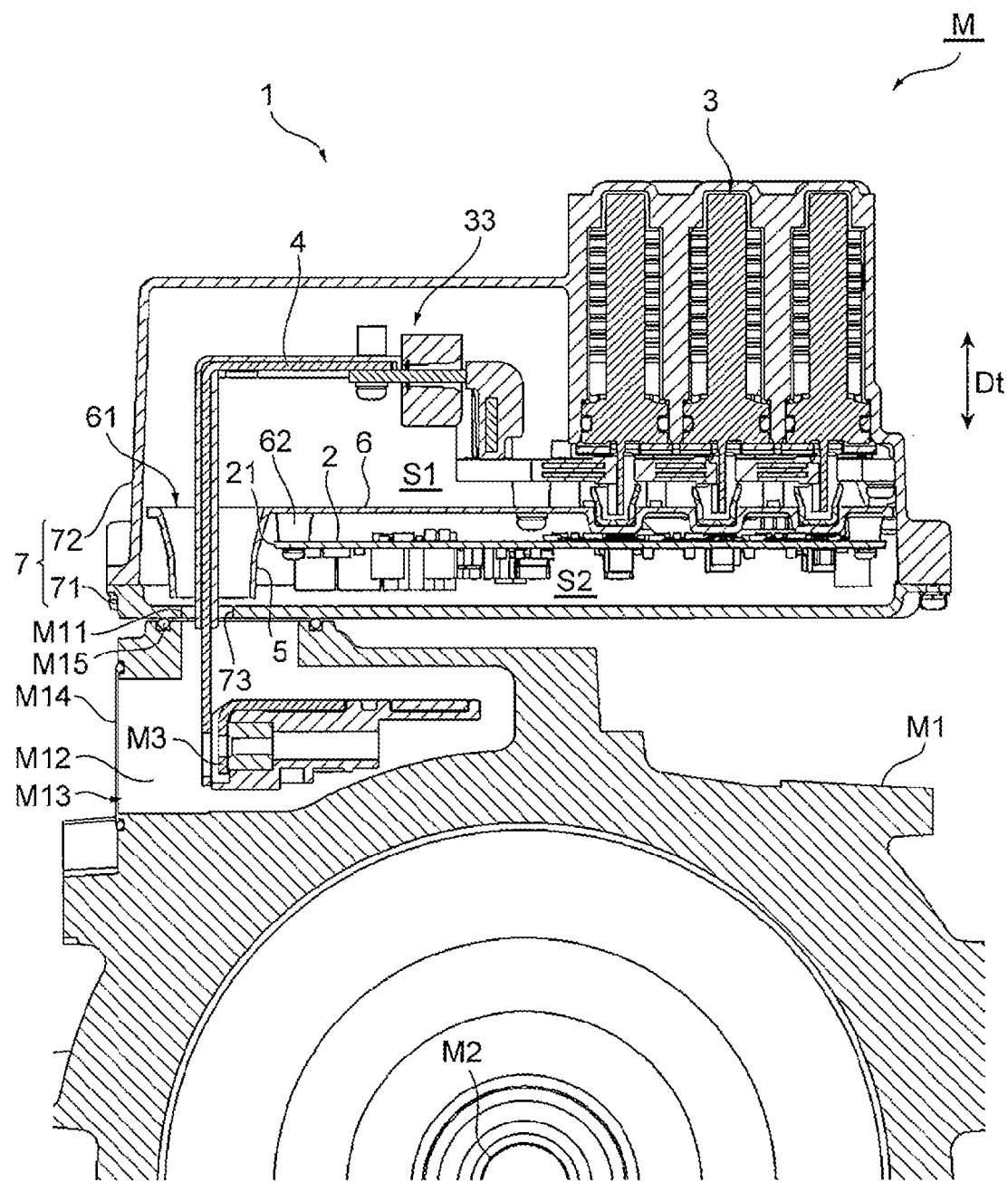
FIG. 3 is a cross-sectional view of the power conversion device and the motor taken along line III-III illustrated in FIG. 1.
Figure 4:
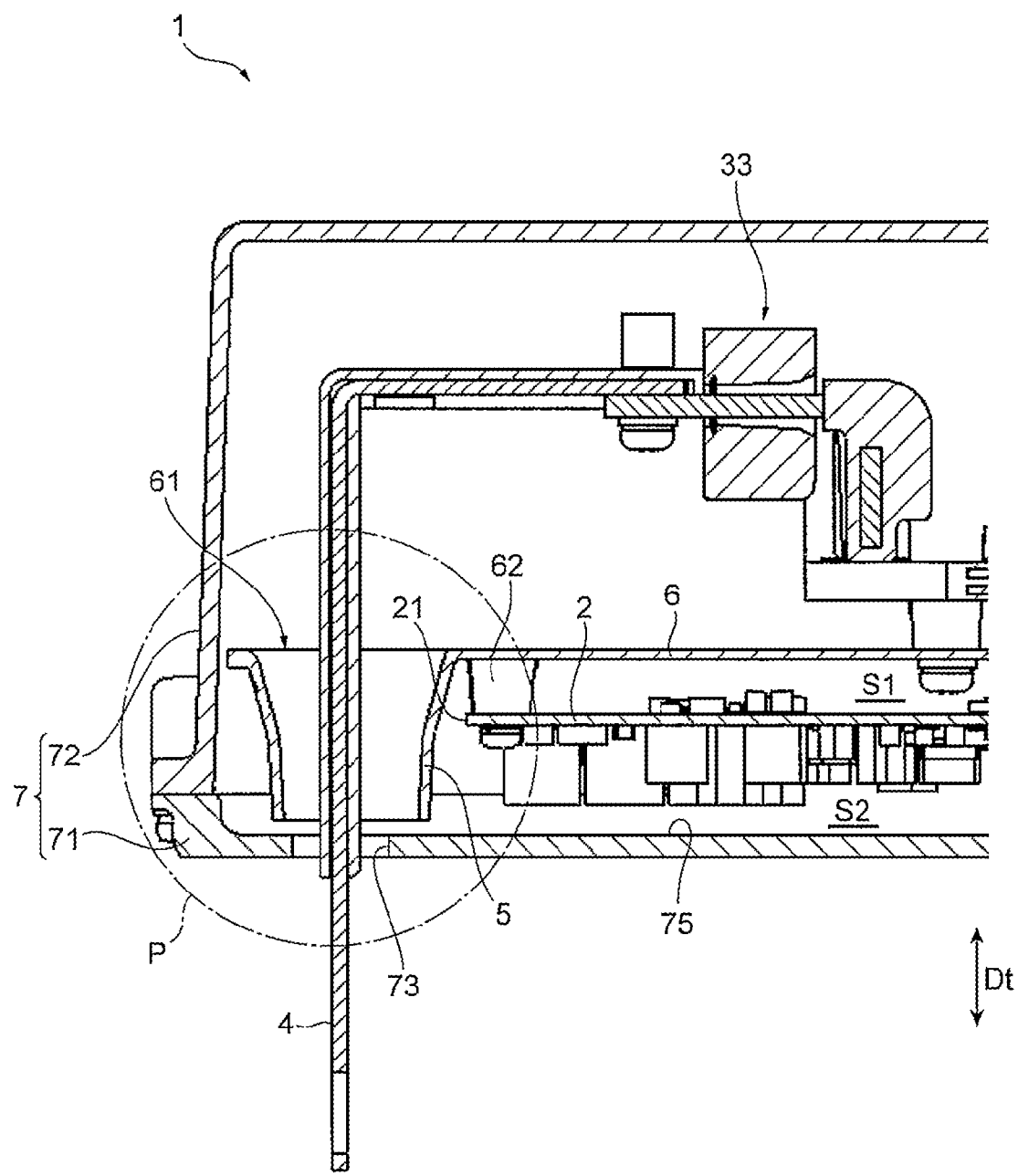
FIG. 4 is an enlarged cross-sectional view of the vicinity of the bus bar illustrated in FIG. 3.

FIG. 1 is a perspective view illustrating an embodiment of a power conversion device and a motor according to the present disclosure. FIG. 2 is an exploded perspective view of a power conversion device 1 and a motor M illustrated in FIG. 1. FIG. 3 is an enlarged cross-sectional view of the power conversion device 1 taken along line III-III of FIG. 1. FIG. 4 is an enlarged view of the vicinity of a bus bar 4 of the power conversion device 1 illustrated in FIG. 3.

The motor M of the present embodiment is mounted on a vehicle such as an electric vehicle (EV), a hybrid vehicle (HV), a plug-in hybrid vehicle (PHV), or a fuel cell vehicle (FCV), and constitutes a drive device of the vehicle. The motor M is, for example, a power conversion device integrated motor in which the power conversion device 1 is attached to a housing M1. The power conversion device-integrated motor has an advantage that the drive device can be downsized as compared with a configuration in which the motor M and the power conversion device 1 are separated from each other.

In addition, the power conversion device 1 of the present embodiment is attached to, for example, the housing M1 of the motor M, converts a DC current supplied from an in-vehicle power supply such as a lithium ion secondary battery or a fuel cell into an AC current, supplies the AC current to the motor M, and drives the motor M. Although details will be described later, the power conversion device 1 of the present embodiment has the following configuration.

The power conversion device 1 includes a circuit board 2, a power conversion module 3 disposed to face the circuit board 2, a bus bar 4 connected to the power conversion module 3, and a shielding portion 5 that shields an electromagnetic wave. The bus bar 4 extends from one side S1 to the opposite side S2 of the circuit board 2 along the thickness direction Dt of the circuit board 2 through the side edge 21 of the circuit board 2. The shielding portion 5 is disposed between the bus bar 4 and the side edge 21 of the circuit board 2, extends from the one side S1 to the opposite side S2 of the circuit board 2 along the thickness direction Dt of the circuit board 2, and extends to both sides of the bus bar 4 along the side edge 21 of the circuit board 2.

Hereinafter, the configuration of the power conversion device 1 of the present embodiment will be described in detail. In addition to the above-described configuration, the power conversion device 1 includes, for example, a base unit 6 disposed between the circuit board 2 and the power conversion module 3, and a casing 7 that supports the base unit 6 and the circuit board 2.

For example, the power conversion module 3, an IC, a transistor, a resistor, and the like are mounted on the circuit board 2, and the circuit board 2 includes an electronic circuit for controlling the power conversion module 3. The circuit board 2 has, for example, a rectangular shape whose longitudinal direction is a direction parallel to the drive shaft M2 of the motor M, and a connector 22 is provided on a short side edge of one end in the longitudinal direction. The connector 22 is connected to a connector of an external harness for supplying power to the circuit board 2 and inputting and outputting signals.

The power conversion module 3 incorporates a switching element, and is controlled by the circuit board 2 to perform mutual conversion between a DC current and an AC current. For example, a filter 31, a capacitor 32, a sensor 33, and the like are connected to the power conversion module 3. For example, the sensor 33 detects the magnitude of the current flowing from the power conversion module 3 to the bus bar 4 to transmit an electrical signal of the detection result to the electronic circuit of the circuit board 2.

The bus bar 4 is power wiring between the power conversion module 3 and a terminal M3 of the motor M, and is a power transmission path. The bus bar 4 can be made of, for example, a metal plate having excellent conductivity such as copper. The three bus bars 4 connected to the power conversion module 3 supply the terminal M3 of the motor M with a three-phase AC current. The bus bar 4 has, for example, a shape in which an elongated plate is bent in an L shape.

The bus bar 4 has, for example, a first portion extending along the front and back faces as the element mounting faces of the circuit board 2 and connected to the power conversion module 3 via the sensor 33, and a second portion extending along the thickness direction Dt of the circuit board 2 and connected to the terminal M3 of the motor M. The bus bar 4 is accommodated in the casing 7 except for the end of the second portion connected to the motor M, and the end of the second portion is exposed from the casing 7. The portion, of the bus bar 4, accommodated in the casing is covered with an electrically insulating resin by, for example, insert molding.

The shielding portion 5 is a member that shields an electromagnetic wave. The shielding portion 5 is disposed between the bus bar 4 and the side edge 21 of the circuit board 2, extends from the one side S1 to the opposite side S2 of the circuit board 2 along the thickness direction Dt of the circuit board 2, and extends to both sides of the bus bar 4 along the side edge 21 of the circuit board 2. The shielding portion 5 is, for example, a plate-like member made of metal along a face parallel to the thickness direction Dt of the circuit board 2 and the side edge 21 of the circuit board 2.

Although not particularly limited, in the present embodiment illustrated in FIGS. 1 to 4, the thickness direction Dt of the circuit board 2 is orthogonal to the drive shaft M2 of the motor M, and the side edge 21 of the circuit board 2 of the motor M is parallel to the drive shaft M2 of the motor M. As illustrated in FIG. 2, in the present embodiment, the shielding portion 5 has a tubular shape around the entire circumference of a through hole 61 of the base unit 6 described later.

As illustrated in FIGS. 2 to 4, the shielding portion 5 is, for example, part of the base unit 6, and is provided integrally with the base unit 6 by press molding, forging, casting, injection molding, or the like.

For example, the shielding portion 5 protrudes from the face, of the base unit 6, facing the circuit board 2 toward the bottom wall portion 71 of the casing 7, passes through the side of the side edge 21 of the circuit board 2 from the one side S1 to the opposite side S2 of the circuit board 2, and extends in the thickness direction Dt of the circuit board 2.

The shielding portion 5 has, for example, a tapered shape in which the opening area decreases as the proximal end portion attached to the base unit 6 is away from the base unit 6. In addition, the distal end portion of the shielding portion 5 in the vicinity of the bottom wall portion 71 of the casing 7 has, for example, a slightly tapered shape, but the opening area of the distal end portion hardly changes in the thickness direction of the circuit board 2 and is substantially constant.

The base unit 6 is a member for holding and fixing the circuit board 2 inside the casing 7. More specifically, the base unit 6 is a plate-like member that is disposed on the one side S1, of the circuit board 2, away from the bottom wall portion 71 of the casing 7 and covers substantially the entire surface, of the circuit board 2, on which the electronic components are mounted. The base unit 6 is formed of a material capable of shielding electromagnetic waves, such as a metal plate or a resin plate having a metal layer on the surface.

The base unit 6 has, for example, the through hole 61 through which the bus bar 4 passes. The through hole 61 of the base unit 6 extends, for example, along the side edge 21 of the circuit board 2, and has both end portions in a semicircular round long hole shape. As described above, in the power conversion device 1 of the present embodiment, the shielding portion 5 has a tubular shape around the entire circumference of the through hole 61 of the base unit 6, for example.

The base unit 6 has, for example, a protruding support portion 62 for supporting the circuit board 2 on one face facing the bottom wall portion 71 of the casing 7. The base unit 6 supports the circuit board 2 with a space from the one face by fastening the circuit board 2 to the support portion 62 with a fastening member such as a screw, for example.

In addition, the base unit 6 has a face, opposite to the one face on which the circuit board 2 is supported, supporting and fixing the power conversion module 3, the filter 31, the capacitor 32, the sensor 33, and the like. As illustrated in FIGS. 3 and 4, the base unit 6 supports the bus bar 4 via the sensor 33 fixed to the base unit 6. That is, one end of the bus bar 4 is fixed to the sensor 33 by a fastening member such as a screw or a nut.

As a result, the bus bar 4 extends in a direction intersecting the side edge 21 from the sensor 33 located inside the side edge 21 of the circuit board 2 to a position outside the side edge 21 along the face, of the circuit board 2, on which the electronic components are mounted. In addition, the bus bar 4 extends from the one side S1 to the opposite side S2 of the circuit board 2 through the side of the side edge 21 of the circuit board 2 in the thickness direction Dt of the circuit board 2 at a position outside the side edge 21 of the circuit board 2. Further, the bus bar 4 passes through the through hole 73 provided in the bottom wall portion 71 of the casing 7 and extends to the outside of the casing 7.

The casing 7 has an accommodation space for accommodating components constituting the power conversion device 1 therein. The casing 7 has, for example, a bottom wall portion 71 and a cover 72 formed of a material having conductivity such as metal. The bottom wall portion 71 is fixed to the housing M1 of the motor M by, for example, a fastening member such as a bolt. The bottom wall portion 71 may be provided integrally with the housing M1 as part of the housing M1 of the motor M, for example.

The bottom wall portion 71 has a plate-like bottom portion that defines a lower end of the accommodation space inside the casing 7, and a peripheral wall portion raised in the thickness direction at a peripheral edge of the bottom portion. The bottom wall portion 71 has the through hole 73 through which the bus bar 4 passes, for example, at an outer edge portion of a plate-like bottom portion. The through hole 73 of the casing 7 forms an interface portion between the power conversion device 1 and the motor M by exposing the bus bar 4 inside the casing 7 to the outside of the casing 7.

The interface portion of the power conversion device 1 is located on the opposite side S2, of the circuit board 2, opposite to the one side S1 on which the base unit 6 is disposed. In addition, the shielding portion 5 protrudes from a through hole 61 of the base unit 6 toward a through hole 73 of the casing 7 constituting the interface portion of the power conversion device 1, and extends to the vicinity of the interface portion located on the opposite side S2 of the circuit board 2 opposite to the one side S1 on which the base unit 6 is disposed.

The cover 72 includes, for example, a plate-like upper wall portion that defines an upper end of the accommodation space inside the casing 7, and a side wall portion that extends from a peripheral edge of the upper wall portion toward a peripheral edge portion of the bottom wall portion 71 and defines a side end of the accommodation space of the casing 7. The lower end face of the side wall portion of the cover 72 is in contact with the upper end face of the peripheral wall portion of the bottom wall portion 71. In this state, the peripheral wall portion of the bottom wall portion 71 and the side wall portion of the cover 72 are fastened by a fastening member such as a bolt and a nut, whereby the casing 7 having an accommodation space therein is configured.

The motor M includes the housing M1 to which the power conversion device 1 is attached and the terminal M3 connected to the bus bar 4. As illustrated in FIGS. 2 and 3, the housing M1 includes a connecting port M11 connected to the through hole 73 of the casing 7, a terminal accommodation chamber M12 that accommodates the terminal M3, and an opening/closing port M13 that opens and closes the terminal accommodation chamber M12. The terminal accommodation chamber M12 is a recessed space provided in the housing M1. Further, around the connecting port M11, for example, a gasket M15 or a waterproof adhesive is disposed. The gasket M15 or the waterproof adhesive seals a gap between the casing 7 of the power conversion device 1 and the housing M1 of the motor M, and prevents water or the like from entering the connecting port 11 from the outside.

When the bottom wall portion 71 of the casing 7 is attached to the housing M1, the bus bar 4 is inserted into the terminal accommodation chamber M12 through the connecting port M11, and the terminal accommodation chamber M communicates with the internal space of the casing 7 through the connecting port M11 and the through hole 73 of the casing 7. The opening/closing port M13 is an opening provided in the housing M1 to expose the terminal M3 and the bus bar 4 inserted into the terminal accommodation chamber M12, and is closed by a lid M14 as illustrated in FIG. 3 after the bus bar 4 is connected to the terminal M3.

Hereinafter, functions of the motor M and the power conversion device 1 of the present embodiment will be described.

Since the motor M is a power conversion device-integrated motor in which the power conversion device 1 is integrally provided, there is an advantage that the drive device of the vehicle can be downsized as compared with a configuration in which the motor M and the power conversion device 1 are separated. On the other hand, a high-voltage circuit including the power conversion module 3 conventionally connected to the terminal M3 of the motor M via a harness is required to be connected to the terminal M3 of the motor M by, for example, the bus bar 4 extending from the inside to the outside of the casing 7.

In such a power conversion device-integrated motor M, the bus bar 4 connecting the power conversion module 3 of the power conversion device 1 and the terminal M3 of the motor M are often required to pass near the circuit board 2. Therefore, there is an increasing demand for a technique for shielding the electromagnetic wave from the bus bar 4 to reduce the influence of the electromagnetic wave on the circuit board 2.

In response to such a request, the power conversion device 1 of the present embodiment includes the circuit board 2, the power conversion module 3 disposed to face the circuit board 2, the bus bar 4 connected to the power conversion module 3, and the shielding portion 5 that shields an electromagnetic wave. The bus bar 4 extends from the one side S1 to the opposite side S2 of the circuit board 2 along the thickness direction Dt of the circuit board 2 through the side edge 21 of the circuit board 2. The shielding portion 5 is disposed between the bus bar 4 and the side edge 21 of the circuit board 2, extends from the one side S1 to the opposite side S2 of the circuit board 2 along the thickness direction Dt of the circuit board 2, and extends to both sides of the bus bar 4 along the side edge 21 of the circuit board 2.

With such a configuration, in the power conversion device 1, the electromagnetic wave from the bus bar 4 toward the circuit board 2 is shielded by the shielding portion 5, and malfunction of the circuit board 2 is prevented. More specifically, the bus bar 4 extending from the one side S1 to the opposite side S2 of the circuit board 2 along the thickness direction Dt of the circuit board 2 through the side edge 21 of the circuit board 2 generates an electromagnetic wave toward the circuit board 2. However, the shielding portion 5 is disposed between the bus bar 4 and the side edge 21 of the circuit board 2, extends from the one side S1 to the opposite side S2 of the circuit board 2 along the thickness direction Dt of the circuit board 2, and extends to both sides of the bus bar 4 along the side edge 21 of the circuit board 2.

The shielding portion 5 can shield the electromagnetic wave from the bus bar 4 extending from the one side S1 to the opposite side S2 of the circuit board 2 along the thickness direction Dt of the circuit board 2 through the side edge 21 of the circuit board 2 toward the circuit board 2. Therefore, according to the present embodiment, it is possible to provide the power conversion device 1 capable of reducing the influence of the electromagnetic wave on the circuit board 2 and enabling miniaturization as compared with the conventional case. In addition, the electromagnetic wave emitted from the bus bar 4 and the circuit board 2 to the outside of the power conversion device 1 can be shielded by the shielding portion 5 and the casing 7 to suppress the emission of the electromagnetic wave from the power conversion device 1 to the outside.

In addition, the power conversion device 1 of the present embodiment includes the base unit 6 disposed between the circuit board 2 and the power conversion module 3, and the casing 7 that supports the base unit 6 and the circuit board 2. The base unit 6 and the casing 7 have the through hole 61 and the through hole 73, respectively, through which bus bar 4 passes. With this configuration, the electromagnetic wave from the power conversion module 3 toward the circuit board 2 can be shielded by the base unit 6. In addition, the bus bar 4 connected to the power conversion module 3 can be exposed to the outside of the casing 7 through the through hole 61 of the base unit 6 and the through hole 73 of the casing 7, and can be connected to the terminal M3 of the motor M.

In the power conversion device 1 of the present embodiment, the shielding portion 5 has a tubular shape around the entire circumference of the through hole 61 of the base unit 6. With this configuration, the tubular shielding portion 5 surrounding the bus bar 4 can more reliably shield the electromagnetic wave emitted from the bus bar 4 toward any direction along the element mounting face of the circuit board 2.

In addition, the motor M of the present embodiment includes the housing M1 to which the power conversion device 1 is attached and the terminal M3 connected to the bus bar 4 of the power conversion device 1. With this configuration, it is possible to provide the motor M including the power conversion device 1 that can reduce the influence of the electromagnetic wave on the circuit board 2 and can be downsized as compared with the related art.

In addition, when the housing M1 includes the connecting port M11 connected to the through hole 73 of the casing 7 and into which the bus bar 4 is inserted, and the terminal accommodation chamber M12 that accommodates the bus bar 4 and the terminal M3, it is possible to prevent the bus bar 4 and the terminal M3 from being exposed to the outside. As a result, the electromagnetic wave emitted from the bus bar 4 to the outside of the power conversion device 1 and the housing M1 is shielded, and the electromagnetic wave from the outside to the inside of the power conversion device 1 and the housing M1 is shielded, so that the bus bar 4 can be prevented from being affected by the electromagnetic wave from the outside.

As described above, according to the present embodiment, it is possible to provide the power conversion device 1 capable of reducing the influence of the electromagnetic wave on the circuit board 2 as compared with the related art and enabling downsizing, and the motor M including the power conversion device 1. Note that the power conversion device and the motor according to the present disclosure are not limited to the configurations of the power conversion device 1 and the motor M described above. Hereinafter, modifications of the above-described embodiment will be described with reference to FIGS. 2 and 5 to 12 aided by FIGS. 1 and 3.

Figure 5:
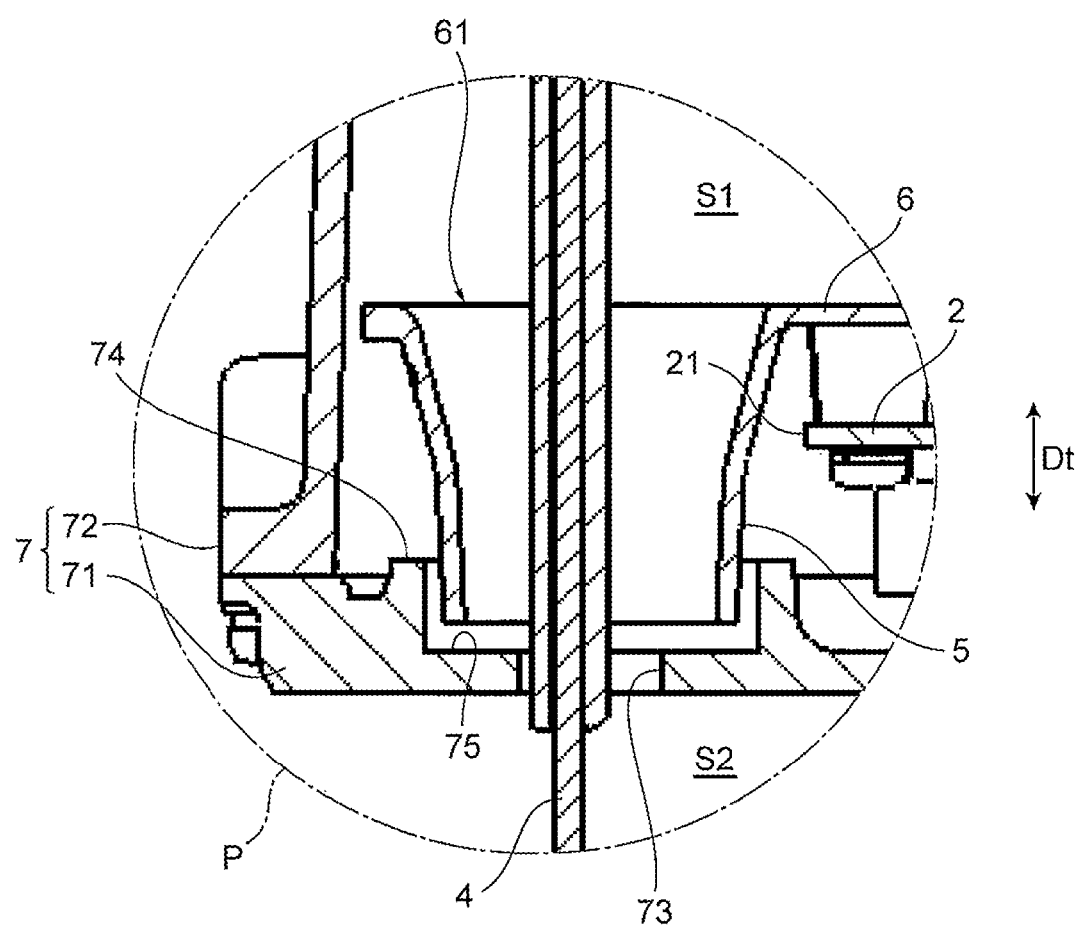
FIG. 5 is an enlarged cross-sectional view showing a first modification of a portion surrounded by a dot-and-dash line in FIG. 4.

FIG. 5 is an enlarged cross-sectional view illustrating a first modification of a portion P surrounded by a dot-and-dash line in FIG. 4.

In the above-described embodiment, as illustrated in FIG. 4, the inner bottom face 75 of the bottom wall portion 71 facing the accommodation space of the casing 7 is flat. On the other hand, in the first modification illustrated in FIG. 5, the power conversion device 1 includes an auxiliary shielding portion 74 having a tubular shape around the through hole 73 of the casing 7 and extending toward the base unit 6. Note that FIG. 2 illustrates an example in which the bottom wall portion 71 of the casing 7 includes the auxiliary shielding portion 74.

In addition, in the power conversion device 1 of the first modification illustrated in FIG. 5, the distal end of the shielding portion 5 is disposed inside the auxiliary shielding portion 74. More specifically, the tubular auxiliary shielding portion 74 protrudes from the face, of the bottom wall portion 71 of the casing 7, facing the circuit board 2 toward the base unit 6 in the thickness direction Dt of the circuit board 2. In addition, the tubular shielding portion 5 protrudes from the face, of the base unit 6, facing the circuit board 2 toward the bottom wall portion 71 of the casing 7 in the thickness direction Dt of the circuit board 2.

The cross-sectional shape of the tubular auxiliary shielding portion 74 and the cross-sectional shape of the tubular shielding portion 5 are substantially the same, and the outer dimension of the tubular shielding portion 5 is smaller than the inner dimension of the tubular auxiliary shielding portion 74. The height dimension from the inner bottom face 75, of the bottom wall portion 71 of the casing 7, where the through hole 73 is formed to the distal end of the auxiliary shielding portion 74 is larger than the gap between the distal end of the shielding portion 5 and the inner bottom face 75. With such a configuration, the distal end of the shielding portion 5 is disposed inside the auxiliary shielding portion 74.

According to the power conversion device 1 of the first modification illustrated in FIG. 5, the electromagnetic wave from the bus bar 4 emitted from the gap between the distal end of the shielding portion 5 and the inner bottom face 75 of the casing 7 to the outside of the shielding portion 5 can be shielded by the auxiliary shielding portion 74. Therefore, according to the present modification, it is possible to provide the power conversion device 1 capable of further reducing the influence of the electromagnetic wave on the circuit board 2 and enabling miniaturization.

Figure 6:
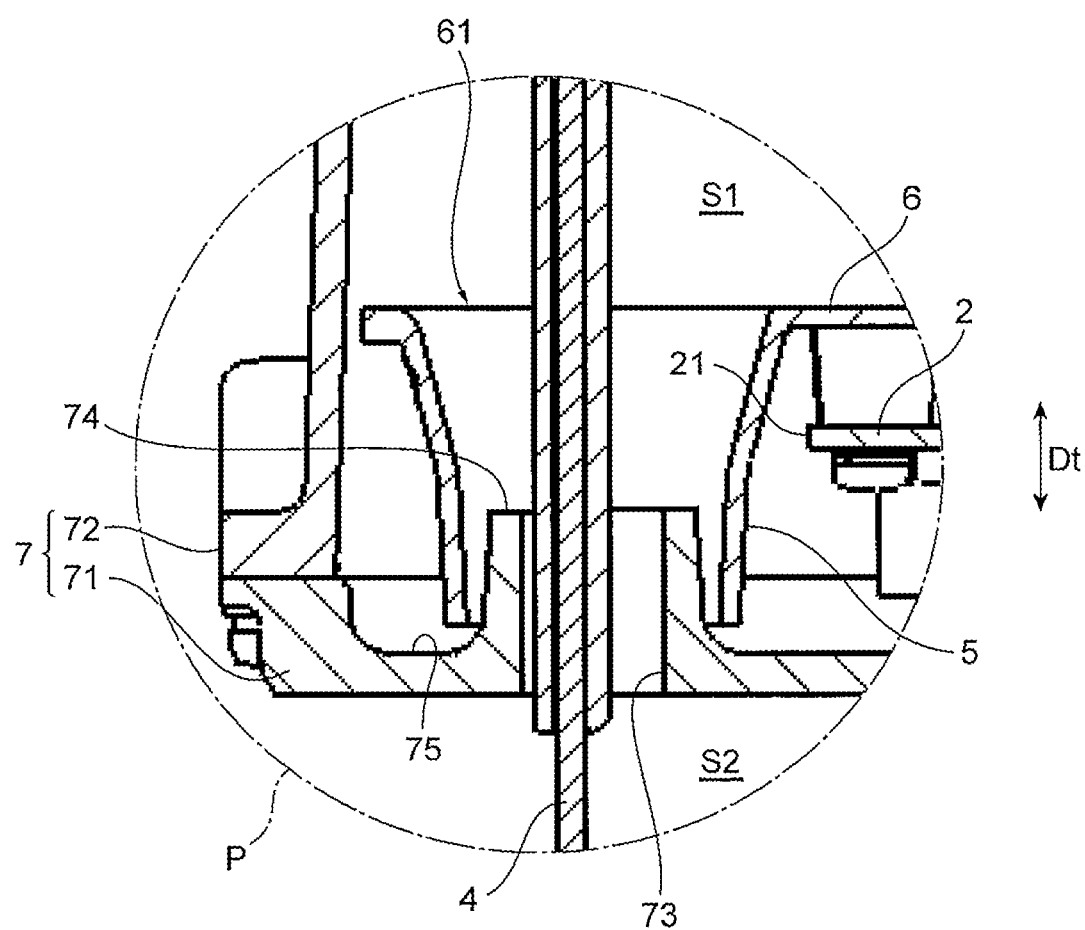
FIG. 6 is an enlarged cross-sectional view showing a second modification of a portion surrounded by a dot-and-dash line in FIG. 4.

FIG. 6 is an enlarged cross-sectional view illustrating a second modification of the portion P surrounded by a dot-and-dash line in FIG. 4.

In the power conversion device 1 of the present modification, the tubular auxiliary shielding portion 74 is disposed inside the distal end portion of the tubular shielding portion 5. More specifically, contrary to the first modification illustrated in FIG. 5, the outer dimension of the tubular auxiliary shielding portion 74 is smaller than the inner dimension of the tubular shielding portion 5. With such a configuration, the auxiliary shielding portion 74 is disposed inside the distal end portion of the shielding portion 5.

According to the power conversion device 1 of the second modification illustrated in FIG. 6, as in the power conversion device 1 of the first modification illustrated in FIG. 5, the electromagnetic wave from the bus bar 4 emitted from the gap between the distal end of the shielding portion 5 and the inner bottom face 75 of the casing 7 to the outside of the shielding portion 5 can be shielded by the auxiliary shielding portion 74. Therefore, according to the present modification, it is possible to provide the power conversion device 1 capable of further reducing the influence of the electromagnetic wave on the circuit board 2 and enabling miniaturization. In addition, as illustrated in FIG. 3, the gasket M15 for sealing a gap between the casing 7 and the motor M1 may be disposed around the through hole 73 of the casing 7 of the power conversion device 1. In this case, by providing the auxiliary shielding portion 74 illustrated in FIG. 6, rigidity and mechanical strength of a portion, of the bottom wall portion 71 of the casing 7, pressed against the gasket M15 are improved. Therefore, it is possible to improve the waterproofness and reliability of the power conversion device 1 by applying a sufficient compressive force to the gasket M15 by the bottom wall portion 71 while preventing the deformation of the bottom wall portion 71 of the casing 7.

Figure 7:
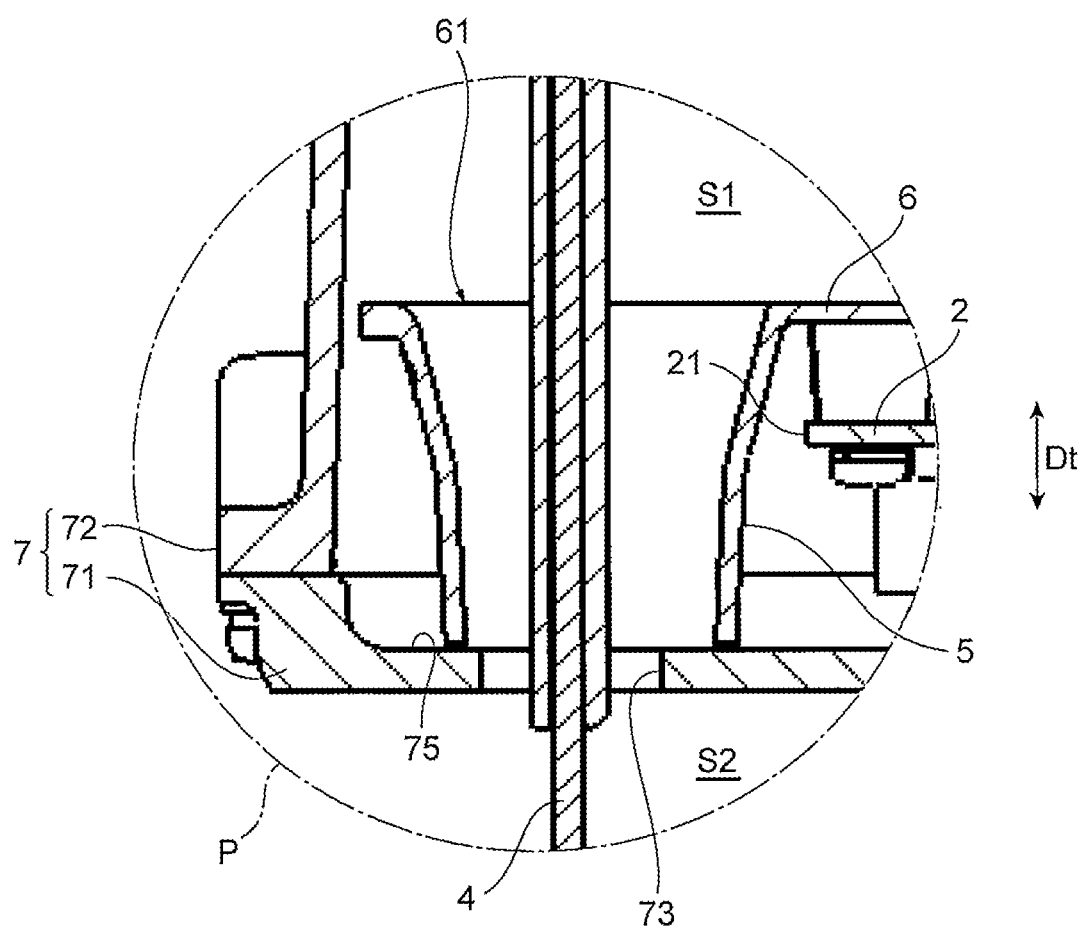
FIG. 7 is an enlarged cross-sectional view showing a third modification of a portion surrounded by a dot-and-dash line in FIG. 4.

FIG. 7 is an enlarged cross-sectional view illustrating a third modification of the portion P surrounded by a dot-and-dash line in FIG. 4.

In the power conversion device 1 of the present modification, the distal end of the shielding portion 5 is in contact with a place around the through hole 73 of the casing 7. Note that the distal end of the shielding portion 5 may be in contact with a place around the through hole 73 of the casing 7 via a conductive adhesive.

According to the power conversion device 1 of the third modification illustrated in FIG. 7, the gap between the distal end of the shielding portion 5 and the inner bottom face 75 of the casing 7 can be eliminated, and the electromagnetic wave emitted from the bus bar 4 toward the outside of the shielding portion 5 can be more reliably shielded by the shielding portion 5. Therefore, according to the present modification, it is possible to provide the power conversion device 1 capable of further reducing the influence of the electromagnetic wave on the circuit board 2 and enabling miniaturization.

Figure 8:
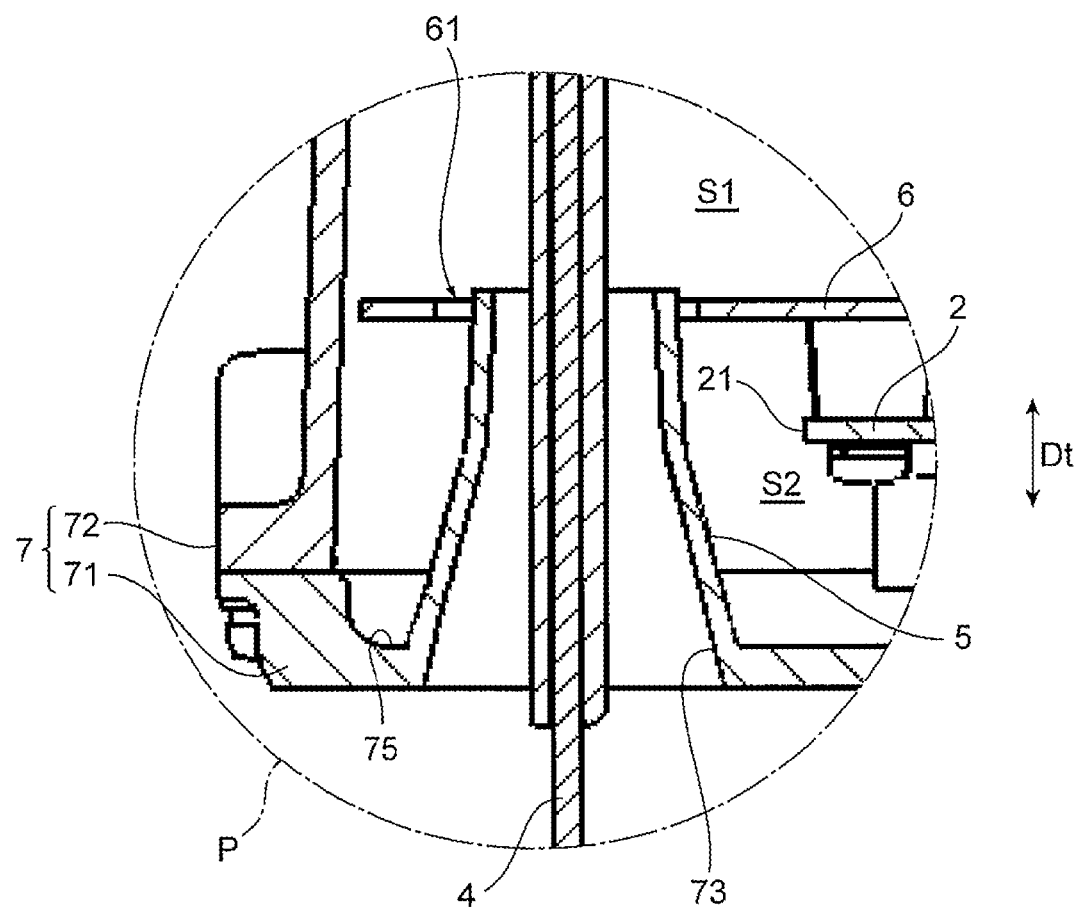
FIG. 8 is an enlarged cross-sectional view showing a fourth modification of a portion surrounded by a dot-and-dash line in FIG. 4.

FIG. 8 is an enlarged cross-sectional view illustrating a fourth modification of the portion P surrounded by a dot-and-dash line in FIG. 4.

In the power conversion device 1 of the present modification, the shielding portion 5 has a tubular shape around the entire circumference of the through hole 73 of the casing 7 instead of the base unit 6. With such a configuration, effects similar to those of the embodiment illustrated in FIG. 4 can be obtained. The tubular shielding portion 5 has a tapered proximal end portion connected to the inner bottom face 75 of the casing 7, and its opening area decreases as approaching the base unit 6. In the tubular shielding portion 5, the distal end portion opposite to the proximal end portion has substantially the same opening area in the thickness direction Dt of the circuit board 2.

Furthermore, in the power conversion device 1 of the present modification, the distal end portion of the shielding portion 5 is inserted into the through hole 61 of the base unit 6. With this configuration, the electromagnetic wave emitted from the bus bar 4 between the base unit 6 and the inner bottom face 75 of the casing 7 can be more reliably shielded by the shielding portion 5.

Therefore, according to the present modification, it is possible to provide the power conversion device 1 capable of further reducing the influence of the electromagnetic wave on the circuit board 2 and enabling miniaturization.

Figure 9:
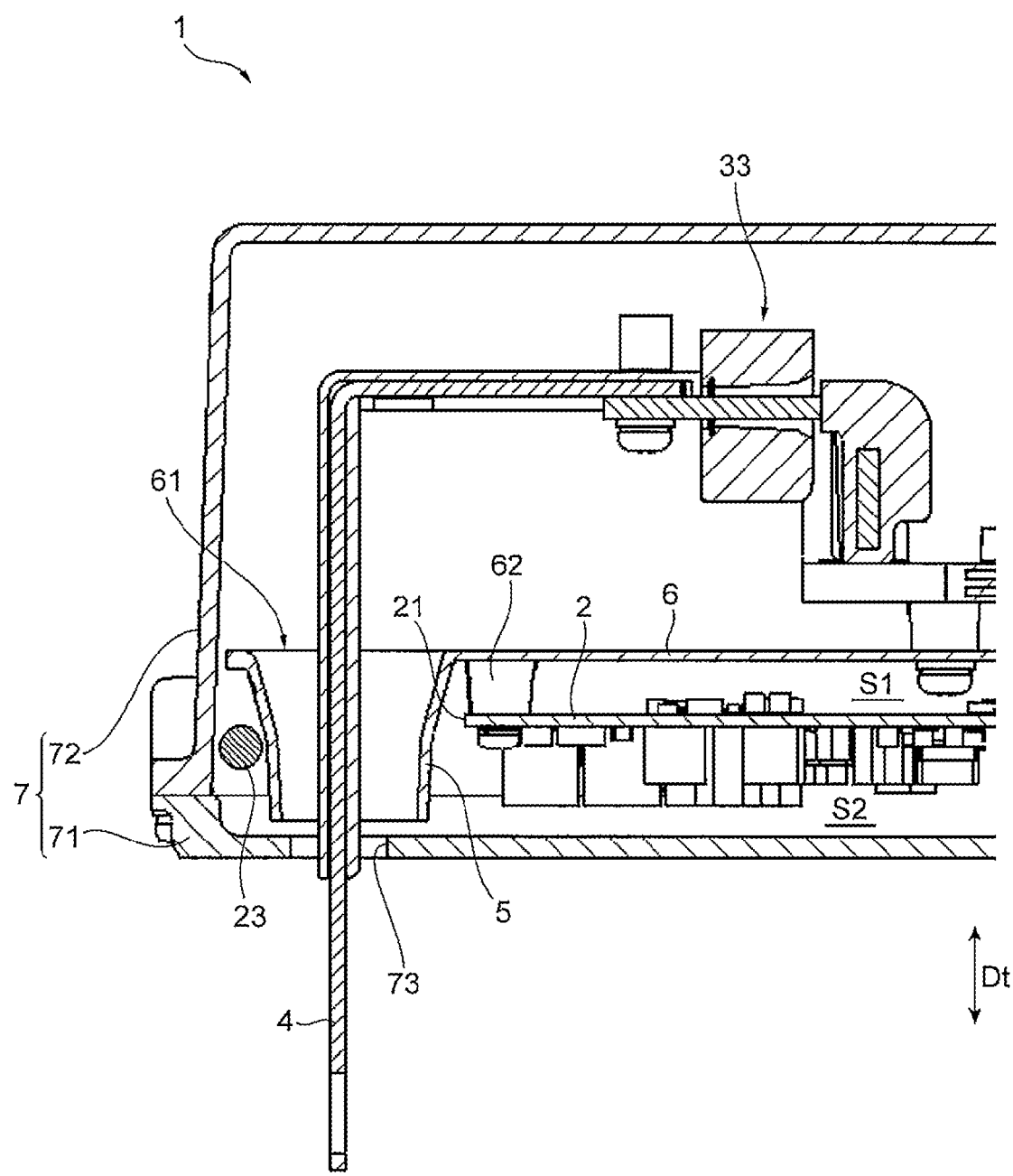
FIG. 9 is an enlarged cross-sectional view of a fifth modification of the power conversion device illustrated in FIG. 4.
Figure 10:
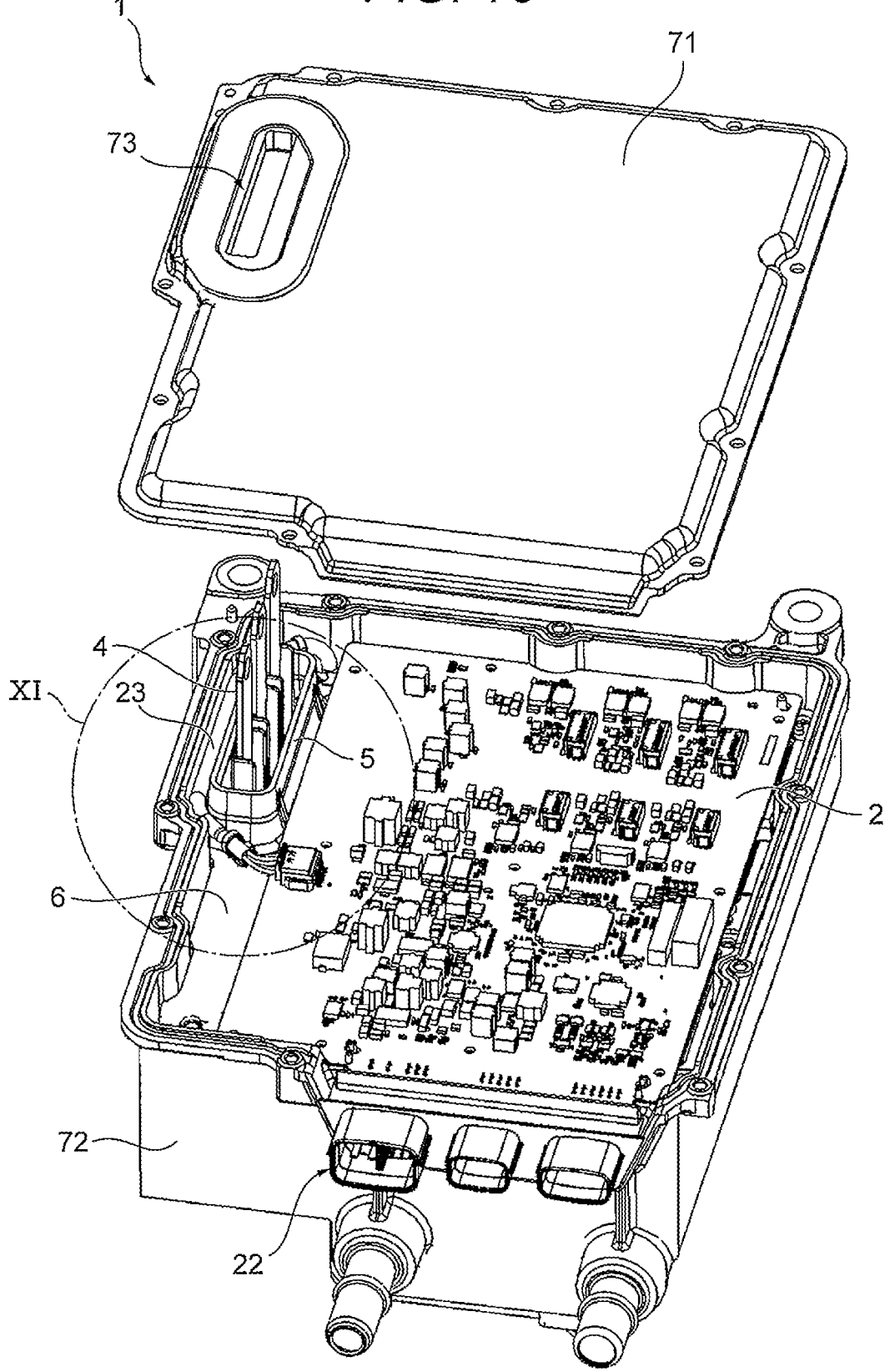
FIG. 10 is a perspective view of a state in which a bottom wall portion of a casing of the power conversion device illustrated in FIG. 9 is removed.
Figure 11:
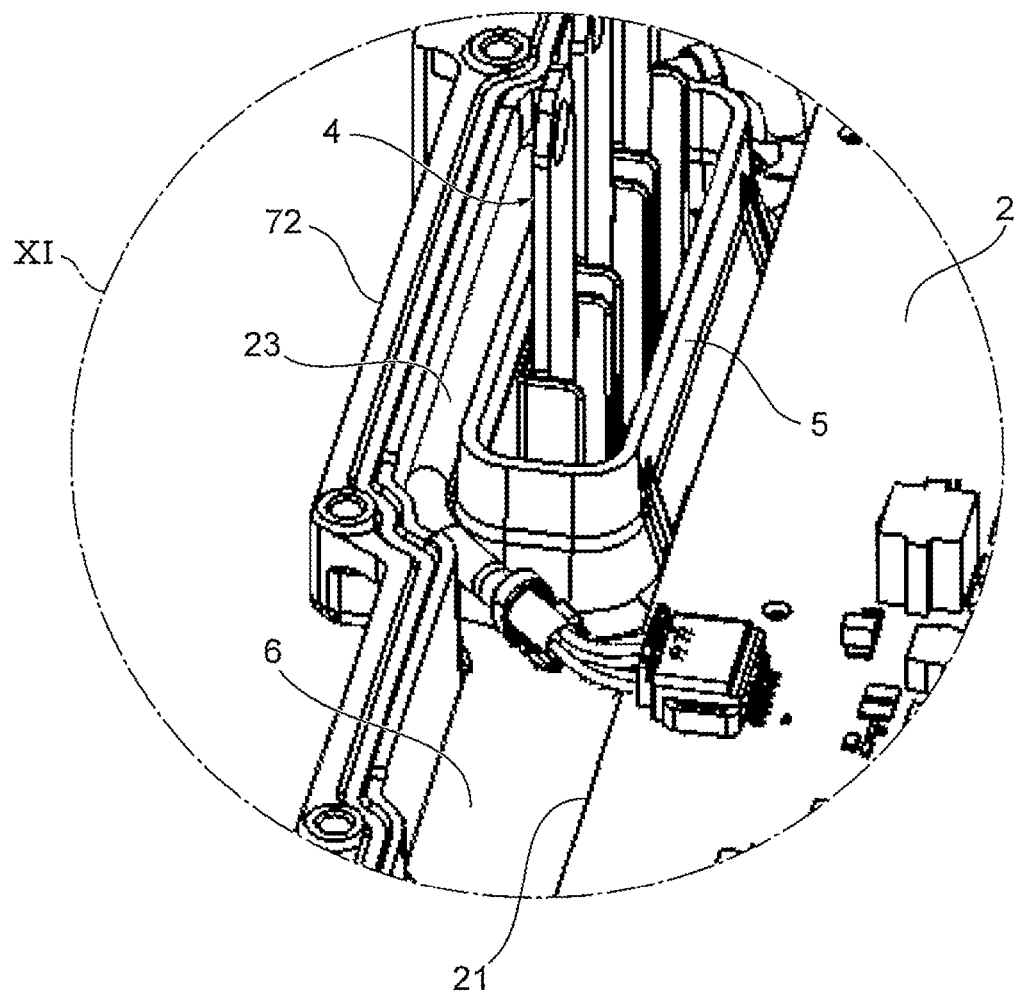
FIG. 11 is an enlarged view of a portion surrounded by a dot-and-dash line in FIG. 10.

FIG. 9 is an enlarged cross-sectional view of a fifth modification of the power conversion device 1 illustrated in FIG. 4. FIG. 10 is a perspective view of a state in which the casing 7 of the power conversion device 1 illustrated in FIG. 9 is turned upside down, and the bottom wall portion 71 is removed. FIG. 11 is an enlarged view of a portion XI surrounded by a dot-and-dash line in FIG. 10. The power conversion device 1 of the present modification includes a signal line 23 connected to the circuit board 2. The signal line 23 is connected to, for example, the sensor 33, the bus bar 4, and the like. The signal line 23 is held between the shielding portion 5 and the casing 7.

According to the power conversion device 1 of the fifth modification illustrated in FIGS. 9 to 11, a space for guiding the signal line 23 is formed between the shielding portion 5 and the casing 7, and the signal line 23 can be held between the shielding portion 5 and the casing 7. As a result, the signal line 23 can be protected from the electromagnetic wave by the shielding portion 5 and the casing 7, and superimposed noise for the signal line 23 can be suppressed.

Figure 12:
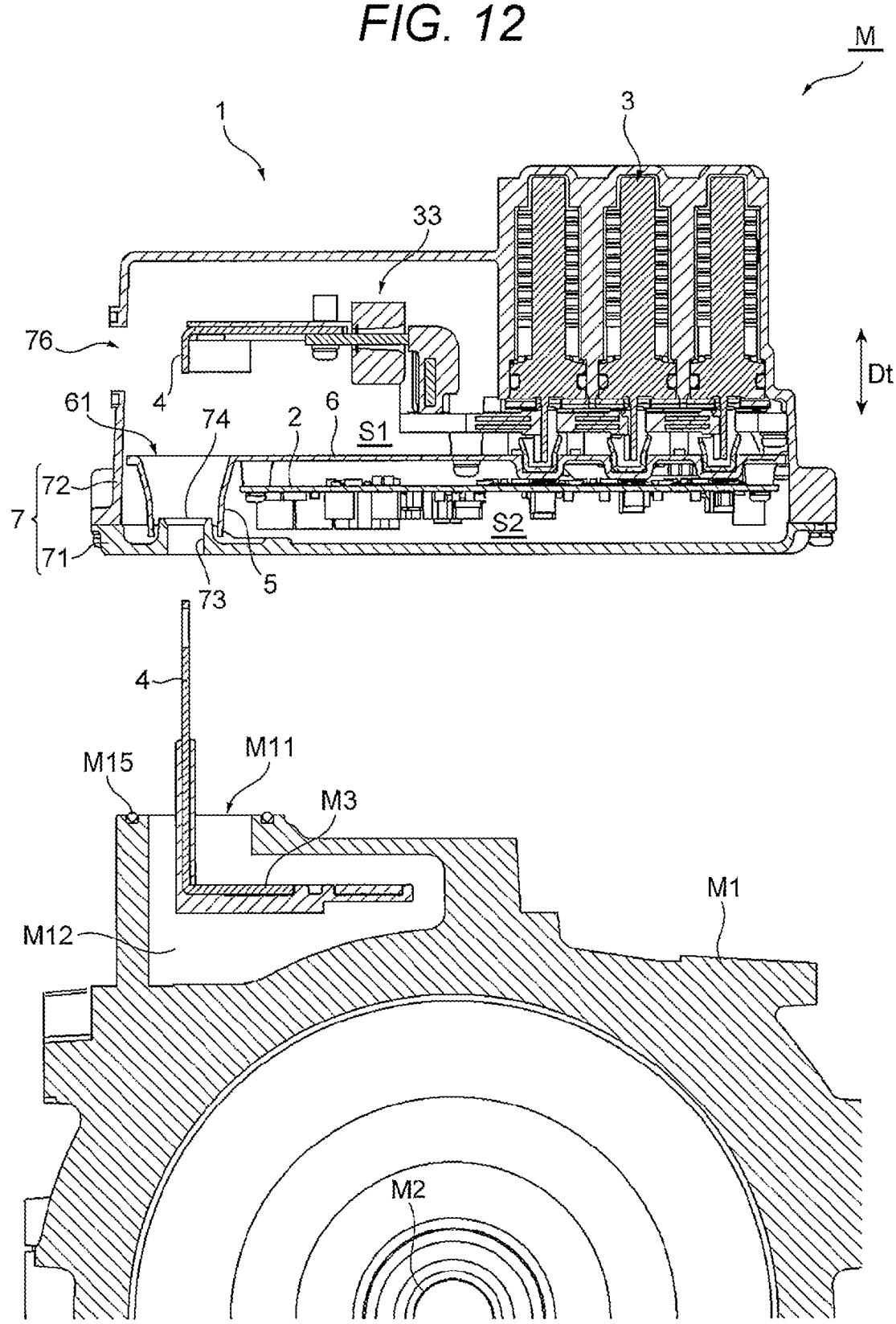
FIG. 12 is a cross-sectional view illustrating a modification of a power conversion device 1 and a motor M in FIG. 3.

FIG. 12 is a cross-sectional view illustrating a modification of the power conversion device 1 and the motor M of FIG. 3. In the present modification, the bus bar 4 has a first portion connected to the power conversion module 3 via the sensor 33 and a second portion provided integrally with the terminal M3 of the motor M. In addition, the casing 7 has an opening 76 for connecting the first portion and the second portion of the bus bar 4. The opening 76 is closed by a lid (not illustrated) after connecting the first portion and the second portion of the bus bar 4. Also in the present modification, effects similar to those of the power conversion device 1 and the motor M of the embodiment illustrated in FIG. 3 can be obtained.

Although the embodiments of the power conversion device and the motor according to the present disclosure have been described in detail with reference to the drawings, the specific configuration is not limited to the embodiments, and design changes and the like without departing from the gist of the present disclosure are included in the present disclosure.

REFERENCE SIGNS LIST 1 power conversion device
2 circuit board 21 side edge
23 signal line
3 power conversion module
4 bus bar
5 shielding portion
6 base unit
61 through hole
7 casing
73 through hole
74 auxiliary shielding portion
Dt thickness direction
M motor
M1 housing
M3 terminal
S1 one side
S2 opposite side

The invention claimed is:

1. A power conversion device comprising:
   a circuit board;
   a power conversion module disposed to face the circuit board;
   a bus bar connected to the power conversion module;
   a shielding portion that shields an electromagnetic wave;
   a base unit disposed between the circuit board and the power conversion module;
   a casing supporting the base unit and the circuit board, wherein each of the base unit and the casing has a through hole through which the bus bar passes; and
   an auxiliary shielding portion having a tubular shape around the through hole of the casing and extending toward the base unit,
   wherein the shielding portion has a tubular shape around an entire circumference of the through hole of the base unit,
   wherein the bus bar extends through a side edge of the circuit board from one side to an opposite side of the circuit board along a thickness direction of the circuit board, and
   wherein the shielding portion is disposed between the bus bar and the side edge of the circuit board, extends from the one side to the opposite side along the thickness direction of the circuit board, and extends to both sides of the bus bar along the side edge of the circuit board.

2. The power conversion device according to claim 1, wherein a distal end of the shielding portion is disposed inside the auxiliary shielding portion.

3. The power conversion device according to claim 1, wherein the auxiliary shielding portion is disposed inside a distal end portion of the shielding portion.

4. The power conversion device according to claim 1, wherein a distal end of the shielding portion is in contact with a place around the through hole of the casing.

5. The power conversion device according to claim 1, wherein the shielding portion has a tubular shape around an entire circumference of the through hole of the casing.

6. The power conversion device according to claim 5, wherein a distal end portion of the shielding portion is inserted into the through hole of the base unit.

7. The power conversion device according to claim 1, further comprising a signal line connected to the circuit board, wherein
   the signal line is held between the shielding portion and the casing.

8. A motor comprising:
   a housing to which the power conversion device according to claim 1 is attached; and
   a terminal connected to the bus bar.

* * * * *